US007672155B2

(12) United States Patent
Kim et al.

(10) Patent No.: US 7,672,155 B2
(45) Date of Patent: Mar. 2, 2010

(54) RESISTIVE MEMORY DEVICES INCLUDING SELECTED REFERENCE MEMORY CELLS

(75) Inventors: Hyun-Jo Kim, Gyeonggi-do (KR); Kyung-Tae Nam, Gyeonggi-do (KR); In-Gyu Baek, Seoul-si (KR); Se-Chung Oh, Gyeonggi-do (KR); Jang-Eun Lee, Gyeonggi-do (KR); Jun-Ho Jeong, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/265,941

(22) Filed: Nov. 6, 2008

(65) Prior Publication Data

US 2009/0067216 A1 Mar. 12, 2009

Related U.S. Application Data

(62) Division of application No. 11/580,766, filed on Oct. 13, 2006, now abandoned.

(30) Foreign Application Priority Data

Nov. 9, 2005 (KR) .......................... 2005-0107178

(51) Int. Cl.
*G11C 11/00* (2006.01)
(52) U.S. Cl. .............. 365/158; 365/189.04; 365/189.14
(58) Field of Classification Search ................. 365/158, 365/189.04, 189.14
See application file for complete search history.

(56) References Cited

U.S. PATENT DOCUMENTS 5,432,731 A 7/1995 Kirsch et al.

(Continued)

FOREIGN PATENT DOCUMENTS

JP 02-110895 4/1990

(Continued)

OTHER PUBLICATIONS

Taiwanese First Office Action and English Translation (18 pages) corresponding to Taiwan Patent Application No. 095141271; Dated: Dec. 17, 2008.

(Continued)

*Primary Examiner*—Hoai V Ho
(74) *Attorney, Agent, or Firm*—Myers Bigel Sibley & Sajovec, P.A.

(57) ABSTRACT

A magnetic memory cell array device can include a first current source line extending between pluralities of first and second memory cells configured for respective simultaneous programming and configured to conduct adequate programming current for writing one of the pluralities of first and second memory cells, a first current source transistor coupled to the first current source line and to a word line, a programming conductor coupled to the first current source transistor and extending across bit lines coupled to the one of the pluralities of first and second memory cells, configured to conduct the programming current across the bit lines, a second current source transistor coupled to the programming conductor and configured to switch the programming current from the programming conductor to a second current source transistor output, a second current source line extending adjacent the one of the pluralities of first and second memory cells opposite the first current source line, a first bias circuit configured to apply a first bias voltage to the first or second memory cells selected for accessed during a read operation, and a second bias circuit configured to apply a second bias voltage to the first or second memory cells unselected for access during the read operation.

4 Claims, 13 Drawing Sheets

U.S. PATENT DOCUMENTS

| | | | |
|---|---|---|---|
| 5,753,946 A | 5/1998 | Naiki et al. | |
| 5,999,439 A | 12/1999 | Seyyedy | |
| 6,246,622 B1 | 6/2001 | Sugibayashi | |
| 6,269,040 B1 | 7/2001 | Reohr et al. | |
| 6,317,376 B1 | 11/2001 | Tran et al. | |
| 6,426,907 B1 | 7/2002 | Hoenigschmid | |
| 6,490,217 B1 | 12/2002 | DeBrosse et al. | |
| 6,504,751 B2 | 1/2003 | Poechmueller | |
| 6,738,285 B2 | 5/2004 | Tanizaki et al. | |
| 6,757,191 B2 | 6/2004 | Ooishi et al. | |
| 6,778,426 B2 | 8/2004 | Hosotani | |
| 6,795,340 B2 | 9/2004 | Sakimura et al. | |
| 6,839,269 B2 | 1/2005 | Iwata et al. | |
| 6,870,759 B2 | 3/2005 | Tsang | |
| 6,982,908 B2 | 1/2006 | Cho | |
| 7,027,342 B2 | 4/2006 | Inoue | |
| 7,116,598 B2 | 10/2006 | Shimizu et al. | |
| 7,286,378 B2 | 10/2007 | Nazarian | |
| 7,313,043 B2 | 12/2007 | Gogl et al. | |
| 2003/0235071 A1 | 12/2003 | Okazawa | |
| 2004/0233709 A1* | 11/2004 | Tsuchida et al. | 365/158 |
| 2005/0036376 A1* | 2/2005 | Iwata et al. | 365/202 |
| 2005/0105329 A1 | 5/2005 | Nazarian | |
| 2005/0128793 A1 | 6/2005 | Ho et al. | |
| 2006/0062066 A1 | 3/2006 | Garni | |

FOREIGN PATENT DOCUMENTS

| | | |
|---|---|---|
| JP | 09-097496 | 4/1997 |
| JP | 2003-257177 A | 9/2003 |
| JP | 2004-23062 A | 1/2004 |
| KR | 10-0449067 | 1/2002 |
| KR | 1020020003296 A | 1/2002 |
| KR | 1020030097697 A | 12/2003 |
| KR | 10-2005-0004160 | 1/2005 |

OTHER PUBLICATIONS

Notice of Allowability for Korean Patent Application No. 10-2005-0107178; May 31, 2007.

Taiwanese First Office Action and English translation (12 pages) corresponding to Taiwanese Patent Application No. 095141271; Issue Date: Jun. 12, 2009.

John DeBrosse et al.; *A High-Speed 128-kb MRAM Core for Future Universal Memory Applications*; IEEE Journal of Solid-State Circuits, vol. 39. No. 4; Apr. 2004, pp. 678-683.

Korean Office Action for corresponding Korean Patent Application No. 10-2005-0124033, 2 pages, (Nov. 20, 2006).

M. Durlam et al; IEEE 2002 Symposium on VLSI Circuits Digest of Technical Papers; pp. 158-161.

Notice of Allowability for Korean Patent Application No. 10-2005-0124033; May 28, 2007.

Taiwanese Preliminary Notice of First Office Action and English translation (5 pages) corresponding to Taiwanese Patent Application No. 095146843; Issue Date: Jul. 13, 2009.

Taiwanese Preliminary Notice of First Office Action and English translation (13 pages) corresponding to Taiwanese Patent Application No. 095146843; Issue Date: Dec. 3, 2009.

* cited by examiner

RESISTIVE MEMORY DEVICES INCLUDING SELECTED REFERENCE MEMORY CELLS

CROSS-REFERENCE TO RELATED APPLICATION

This application is a divisional application of and claims priority to copending U.S. patent application Ser. No. 11/580,766, filed Oct. 13, 2006, which claims priority to Korean Patent Application No. 2005-0107178, filed in the Korean Intellectual Property Office on Nov. 9, 2005, the disclosure of which is incorporated herein by reference.

FIELD OF THE INVENTION

The present invention relates generally to integrated circuits and, more particularly, to resistive memory devices.

BACKGROUND

It is known that some random access non-volatile memory devices can store data by altering the resistance of the memory cells therein. Such devices are commonly referred to as resistive random access memories (ReRam). In operation, a ReRam memory cell can be programmed by changing the resistance of the cell. For example, a logical data value of zero can be programmed by changing the resistance of the cell to a relatively low value, whereas as a logical data value of one can be programmed by changing the resistance of the cell to a relatively high value.

One type of ReRam is a magnetic random access memory (MRAM), which combines semi-conductor electronics and magnetics. In MRAMs, the spin of an electron, rather than the charge, can be used to indicate whether the data stored in the cell is a logical data value of one or zero.

One type of architecture used in MRAMs provides conductive lines that extend perpendicular to one another so that the conductive lines intersect with one another (sometimes referred to as a cross-point arrangement). The cells used to store data are positioned at the intersections of the perpendicular conductive lines and can be configured as a magnetic tunnel junction (MTJ) device that is accessed using an access transistor.

Data can be stored in a cell of the cross-point MRAM by generating a current in each of the conductive lines that intersect at the data cell. In particular, each of the currents flowing in the intersecting conductive lines can generate respective magnetic fields which, when combined, can affect the alignment of the magnetic moment provided by the MTJ, which can alter the resistance of the cell. For example, a first combination of magnetic fields generated by the intersecting currents can orient the magnetic moment in a first direction so that the resistance offered by the cell corresponds to a logical data value of 0. In contrast, a second combination of magnetic fields can generate an opposing magnetic moment so that the resistance of the cell is altered to indicate a logical data value of 1. Accordingly, data can be written to the cells of the MRAM by causing currents to flow in intersecting conductive lines to change the resistance offered by the cell when accessed.

FIG. 1 illustrates an equivalent circuit including a conventional cross-point MRAM where data cells are located at intersections of wordlines (WL1-3) and bitlines (BL1-4). According to FIG. 1, a data cell $C_s$ located at the intersection of BL2 and WL2 can be written by generating respective currents $I_{WL}$ and $I_{BL}$. The currents $I_{WL}$ and $I_{BL}$ both generate respective magnetic fields (the "hard" magnetic field and the "easy" magnetic field) in the data cell to be written. The particular combination of the magnitudes and directions of the $H_{hard}$ and $H_{easy}$ magnetic fields can cause the resistance of the data cell to be altered. The directions of the magnetic fields $H_{hard}$ and $H_{easy}$, are based on the directions of the currents $I_{WL}$ and $I_{BL}$.

Furthermore, ideally the magnetic fields generated by the current $I_{WL}$ at the remaining intersections (BL1, 3, and 4) are insufficient, by themselves, to alter the resistance of those remaining cells. It is desirable to use the combined affect of the easy and hard magnetic fields on the data cell so that the write operation to data cell $C_s$ may be achieved. In other words, FIG. 1 shows that a magnetic fields $H_{hard}$ is generated in the remaining cells due to the current $I_{WL}$ even those remaining cells are not selected for programming. If the magnetic field $H_{hard}$ for the unselected memory cells were sufficient to change the state of the unselected data cells, the data stored therein may be unintentionally modified during the write of the selected data cell $C_s$.

FIG. 2 shows a range of asteroidal graphs indicating variations in magnetic fields that can affect the resistance of different MRAM cells due to process variations in manufacturing the MRAMs. In particular, FIG. 2 illustrates the different possible combined magnetic fields needed to program data to a particular MRAM data cell. As shown in FIG. 2, a first asteroidal curve AC1 indicates that a first MRAM data cell can be programmed by any combination of the $H_{hard}$ and $H_{easy}$ magnetic fields on the curve. It will be understood that the terms $H_{hard}$ and $H_{easy}$ refer to the magnetic fields generated in the long and short directions of the data cell, respectively. The asteroidal curve AC2 is shifted to the right relative to the asteroidal curve AC1 and represents a second MRAM data cell which (because of process variation) is programmed according to different $H_{hard}$ and $H_{easy}$ magnetic fields. Accordingly, in order to ensure that data can be programmed to any of the cells in the MRAM represented in FIG. 2, the $H_{hard}$ and $H_{easy}$ magnetic fields applied should be in the area referred to as "Write Margin" in FIG. 2. In other words, because of process variations, a worse case assumption may be made regarding the $H_{hard}$ and $H_{easy}$ magnetic fields that may be needed to program data. Therefore, as shown in FIG. 2, if the asteroidal curve AC2 reflects a "worst case" operation for a data cell in the MRAM, the MRAM operates with a relatively narrow write margin.

Although both the $H_{hard}$ and $H_{easy}$ magnetic fields are usually applied to a data cell in order to accomplish a write operation, it is possible to program a data cell using only one of these magnetic fields. For example, as shown in FIG. 2, the first asteroidal curve AC1 shows that if the corresponding data cell is written with, for example, an easy magnetic field that exceeds He', the state of the data cell may be changed without any contribution of the hard magnetic field Hh'.

FIG. 3 is an equivalent diagram showing, what is referred to as a simultaneous write operation. In particular, a group of data cells $C_s$ can be programmed by applying a current $I_{WL}$ to WL2 and currents $I_{BL1-4}$ to bitlines BL1-BL4. As shown in FIG. 3, the combination of the respected easy and hard magnetic fields generated for each of the programmed data cells included in $C_s$ operates to change the resistance of the data cells $C_s$. As shown in FIG. 4, this type of simultaneous write operation can provide for additional write margin as the same hard magnetic field is provided to each of the commonly selected data cells included in $C_s$.

Once data is programmed to the MRAM, the data may be read through biasing of selected data cells so that the respective resistances of those data cells may be evaluated to determine the data stored therein. In particular, different bias voltages may be applied across data cells (using the respective bitlines and wordlines/digitlines) to cause a current to flow to/from the selected data cell. The associated resistance of the data cell can be determined based on the generated current.

The structure and operation of magnetic random access memories is also discussed in, for example, U.S. Pat. No. 6,839,269 to Iwata et al. and U.S. Pat. No. 6,504,751 to Poechmueller.

SUMMARY

In some embodiments according to the invention, a magnetic memory cell array device can include a first current source line extending between pluralities of first and second memory cells configured for respective simultaneous programming and configured to conduct adequate programming current for writing one of the pluralities of first and second memory cells, a first current source transistor coupled to the first current source line and to a word line, a programming conductor coupled to the first current source transistor and extending across bit lines coupled to the one of the pluralities of first and second memory cells, configured to conduct the programming current across the bit lines, a second current source transistor coupled to the programming conductor and configured to switch the programming current from the programming conductor to a second current source transistor output, a second current source line extending adjacent the one of the pluralities of first and second memory cells opposite the first current source line, a first bias circuit configured to apply a first bias voltage to the first or second memory cells selected for accessed during a read operation, and a second bias circuit configured to apply a second bias voltage to the first or second memory cells unselected for access during the read operation.

DESCRIPTION OF THE EMBODIMENTS ACCORDING TO THE INVENTION

Figure 1:
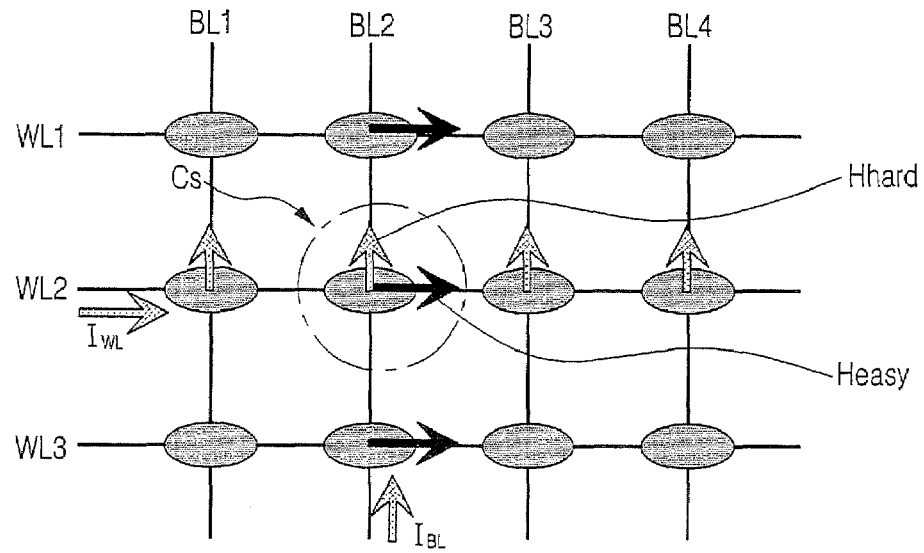
FIG. 1 is an equivalent circuit illustrating a cross-point configuration of a conventional MRAM.
Figure 2:
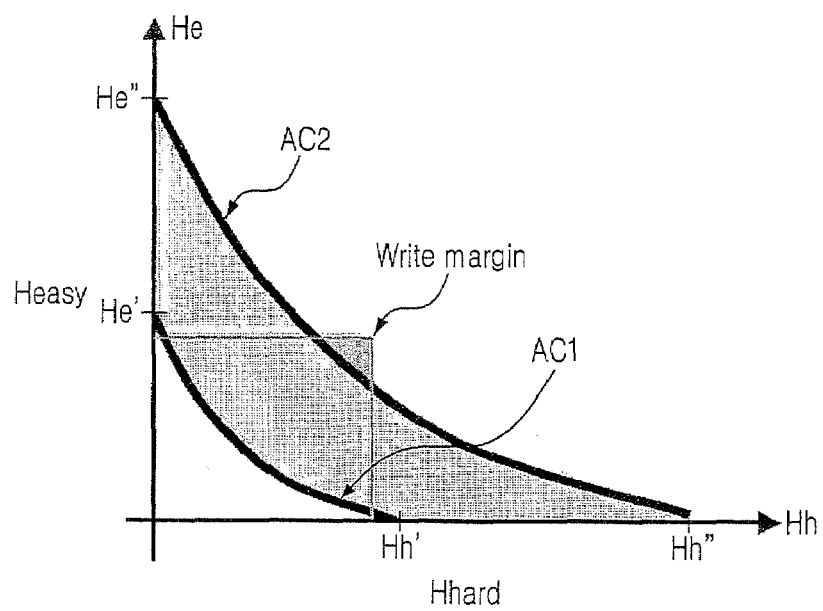
FIG. 2 is a graphical representation of asteroidal curves for data cells in a conventional MRAM.
Figure 3:
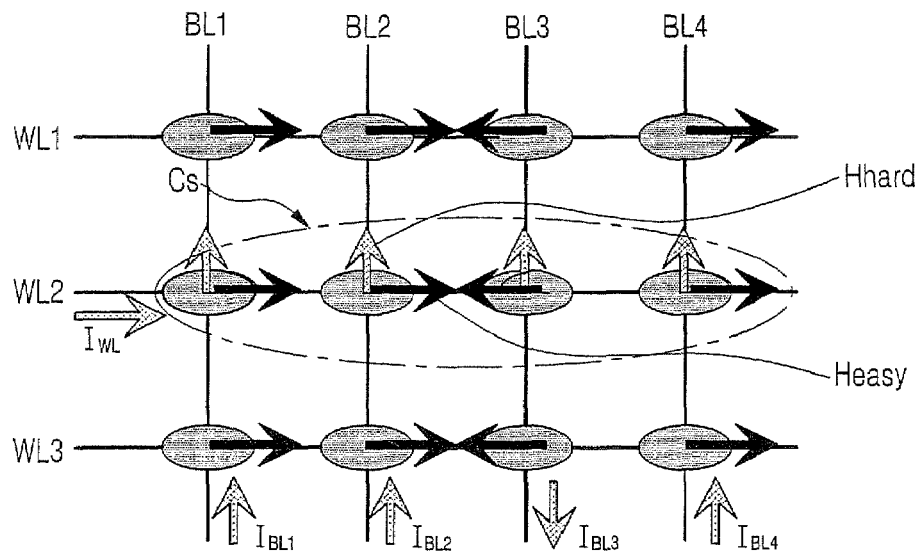
FIG. 3 is an equivalent circuit of a conventional MRAM programmed using a simultaneous write operation.
Figure 4:
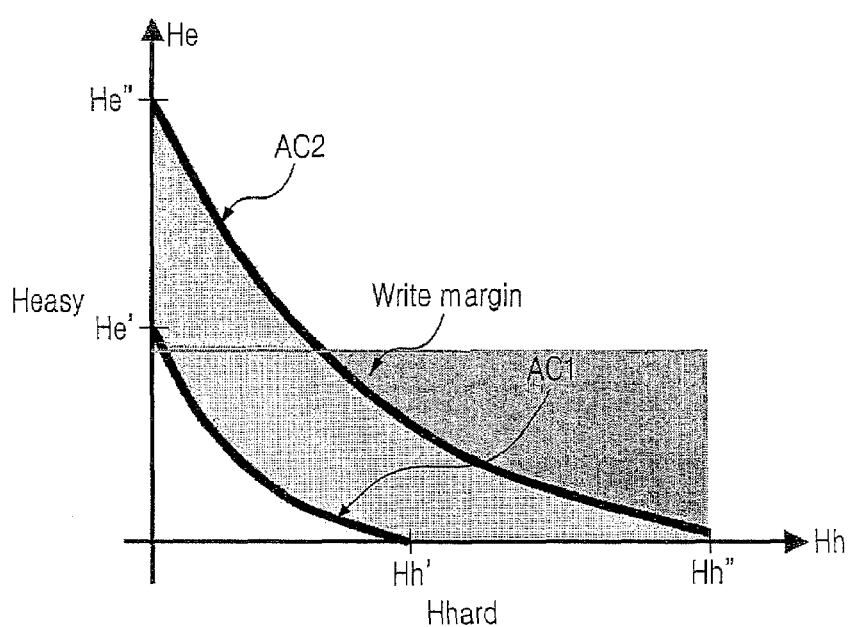
FIG. 4 is a graphical representation of asteroidal curves for data cells in a conventional MRAM and an associated write margin programmed using a simultaneous write operation.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In some embodiments according to the invention, a resistive memory device can be read by applying a predetermined voltage level to a first word line coupled to a first resistive memory cell during a read operation of a second resistive memory cell that is coupled to a second wordline. For example, in an operation where a first group of memory cells is to be simultaneously read from a block, a first voltage level can be applied to wordlines of memory cells that are not selected for the read operation, whereas a second voltage can be applied to the wordline that is coupled to the memory cells that are selected for the read operation.

Furthermore, the bitlines coupled to the resistive memory cells (both selected as well as the nonselected) can have the first voltage level applied thereto so that the unselected memory cells are substantially non-biased due to the fact that the associated bitline and wordline for each of the unselected memory cells has substantially the same voltage applied thereto. In contrast, the memory cells that are selected for the read are biased by the different voltages applied to the bitlines and wordlines of the selected memory cells. The non-biasing of the unselected memory cells may avoid the generation of parasitic currents which may otherwise increase/decrease the current generated by biasing of the selected memory cells. If unaddressed, the parasitic currents can, therefore, affect operation of sense amplifier circuits which (if the parasitic currents are significant enough) cause errors during the read operation.

In still other embodiments according to the invention, current used to program resistive memory cells in a block of the device can be conducted across a single block of resistive memory cells to be programmed. The programming current may be provided to the block to be programmed by conducting the programming current between adjacent blocks of resistive memory cells to a first current source transistor that is located on a first opposing side of the block of resistive memory cells to be programmed. The first current source transistor is used to transfer the programming current from the area between the adjacent blocks of resistive memory cells to across the block of memory cells to be programmed. Furthermore, a second current source transistor is located opposite the first current source transistor and is located between the block of the resistive memory cells to be programmed and a further adjacent block of resistive memory cells which are not to be programmed.

The second current source transistor can conduct the programming current away from the block of resistive memory cells to be programmed in the area that separates the adjacent resistive memory block. Accordingly, conducting the programming currents using the two opposing current source transistors allows the programming current to be conducted across bitlines in the block of resistive memory cells to be programmed while avoiding conducting the programming current across bitlines included in adjacent blocks of resistive memory cells that are not to be programmed. Avoiding conducting the programming current across the bitlines of resistive memory cells that are not to be programmed can reduce the likelihood of disturbing the data stored in the resistive memory cells which are not to be programmed, thereby reducing the likelihood of an error for a read of the disturbed resistive memory cells.

In other embodiments according to the invention, a resistive memory device can include first and second bias circuits that are configured to apply voltage levels to both selected as well as unselected wordlines during a read operation. For example, in some embodiments according to the invention, a first bias circuit can be used to generate a voltage level that is applied to the wordlines connected to resistive memory cells that are to be read, whereas a second bias circuit can be used to generate the second voltage level applied to the wordlines coupled to the memory cells that are not to be read. Although many of the embodiments described herein reference MRAM devices, embodiments according to the invention can also be provided for other types of resistive memory devices, such as PRAMs and OxRAMs.

Figure 5:
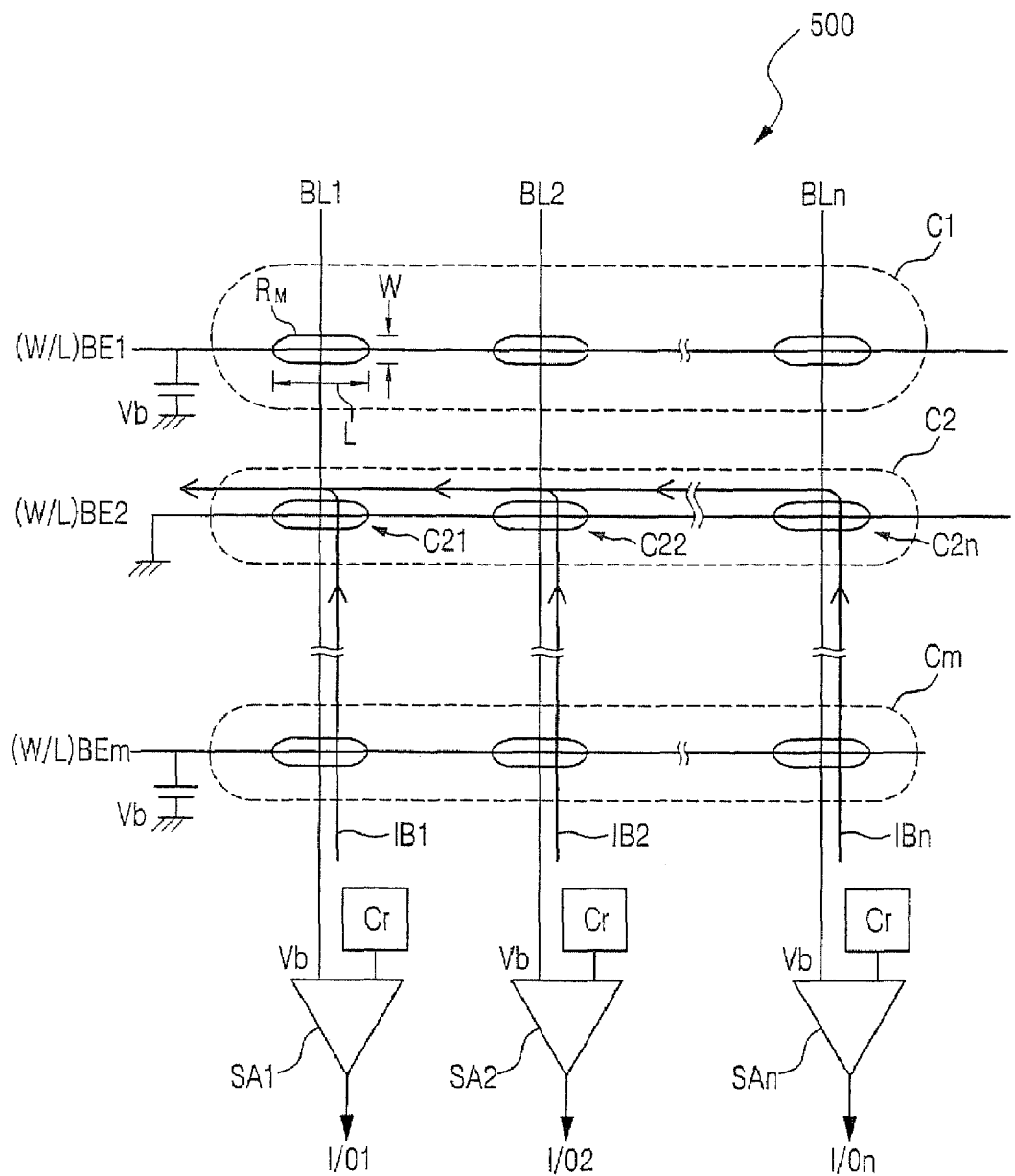
FIG. 5 is an equivalent circuit showing a cross-point configuration of data cells in an MRAM accessed by a read operation according to some embodiments of the invention.
Figure 15:
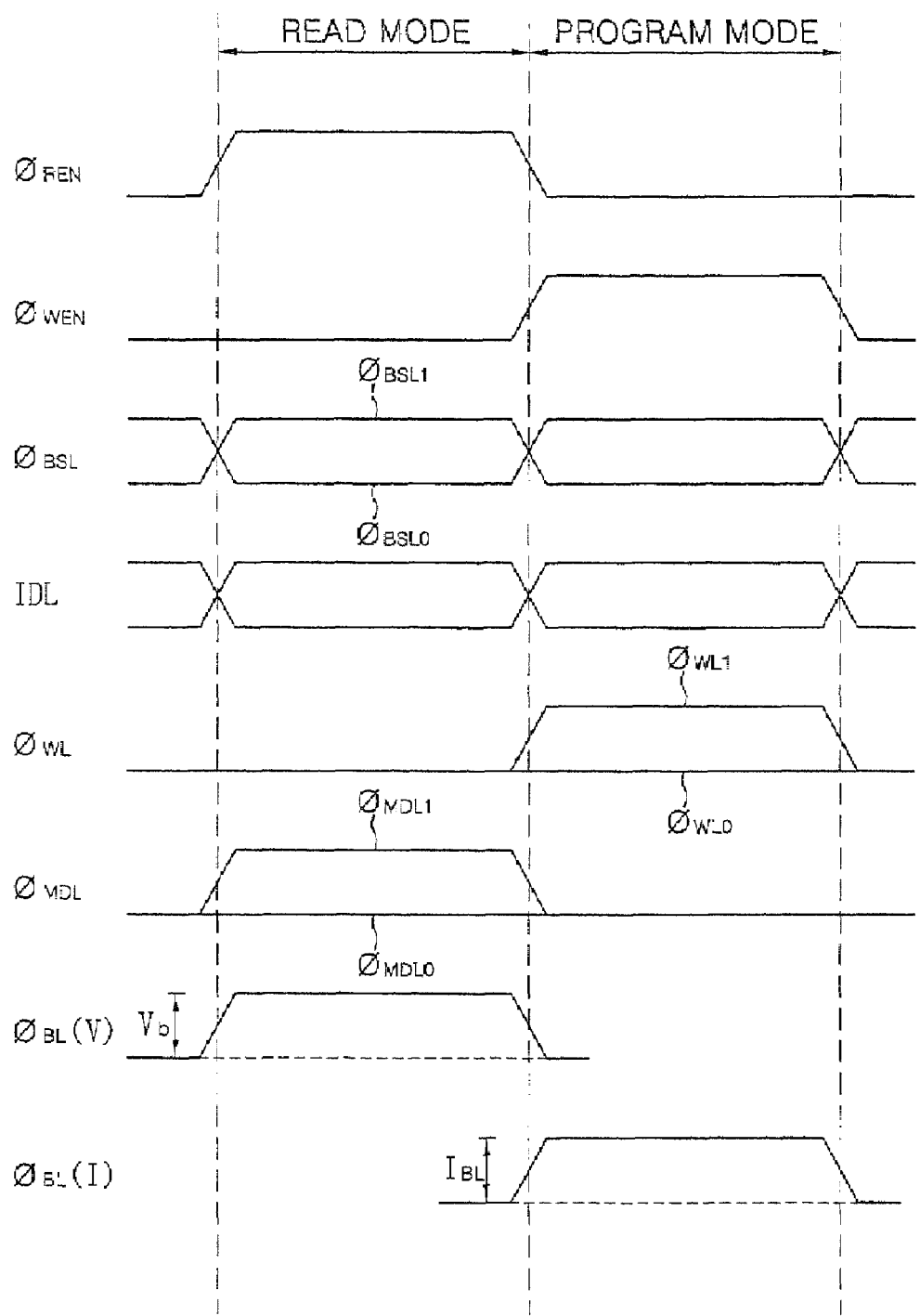
FIG. 15 is a timing diagram illustrating read and program operations of MRAMS according to some of the embodiments of the invention.

FIG. 5 is an equivalent circuit diagram illustrating a block of resistive memory cells having biasing applied thereto during a simultaneous read operation in some embodiments according to the invention. In particular, a block of resistive memory cells 500 includes resistive memory cells $R_m$ arranged in rows and columns. The rows of resistive memory cells $R_m$ are coupled to respective bottom electrode signal lines (BE1-M) which also correspond to wordlines used to access the rows of the resistive memory cells $R_m$. The columns of the resistive memory cells $R_m$ are coupled to respective bitlines (BL1-$n$) which are also coupled to respective sense amplifier circuits SA1-$n$. According to FIG. 5, the sense amplifier circuits SA1-$n$ provide output data based on a comparison of a bias voltage ($V_b$) and a reference voltage provided by a reference circuit $C_r$. A read operation can be carried out using the signal levels shown in FIG. 15 in some embodiments according to the invention.

In operation, a first voltage level is applied to a row of resistive memory cells via the respective bottom electrode signal line BE1-$m$. A second voltage level is provided to each of the bitlines BL1-$n$ for which a resistive memory cell is to be accessed. Therefore, a voltage is provided across each of the resistive memory cells $R_m$ that is to be accessed during the simultaneous read operation. The biasing across the accessed resistive memory cells $R_m$ provides for a current in proportion with the resistance provided by each of the accessed resistive memory cells $R_m$. The logical data value stored within each of the resistive memory cells $R_m$ can be determined based on the current/resistance associated with each of the resistive memory cells $R_m$ in response to the biasing.

In some embodiments according to the invention, the biasing provided to the bitlines BL1-$n$ is also provided to the bottom electrode signal lines of cells that are not selected for access during the read operation. For example, as shown in FIG. 5, a group of resistive memory cells $C_2$ is accessed during the simultaneous read operation by providing biasing to the bottom electrode signal line BE2 and to each of the remaining bottom electrode signal lines BE. It will be understood that the voltage levels provided to the bottom electrode signal line BE2 and to the bitlines BL1-$n$ are different from one another so that a bias can be provided across each of the resistive memory cells in the group $C_2$. As further shown in FIG. 5, the groups of resistive memory cells $C_1$-$C_m$ (excluding the group $C_2$) are provided with the same voltage levels via the bottom electrode signal lines and the bitlines connected thereto.

In particular, the group C1 of resistive memory cells that is not to be accessed during the read operation is provided with substantially equal biasing by the bottom electrode signal line BE1 and the bitline BL1-$n$. Similarly, the group of resistive memory cells Cm which is not be accessed during the read operation is provided with substantially equal voltage levels at both the bottom electrode signal line M and the respective bitlines BL1-$n$. The substantially equal voltage levels provided across the unselected resistive memory cells in groups $C_1$-$C_m$ (excluding the group $C_2$) provides substantially non-biasing so that any parasitic currents generated by the unselected resistive memory cells can be reduced. Otherwise, any parasitic currents generated by floating of unselected resistive memory cells may affect the currents generated by the biasing across the selected resistive memory cells, which in turn may cause read errors due to the addition/subtraction of the parasitic currents to/from the currents generated by the biasing across the selected resistive memory cells $C_p$.

It will be understood that the voltage level provided to the bottom electrode signal line coupled to the resistive memory cells to be read can be greater than or less than the biasing provided by the bitlines BL1-$n$. It will be further understood that the bottom electrode signal lines BE1-$m$ can be equivalent to wordlines W/L1-$m$.

Figure 6:
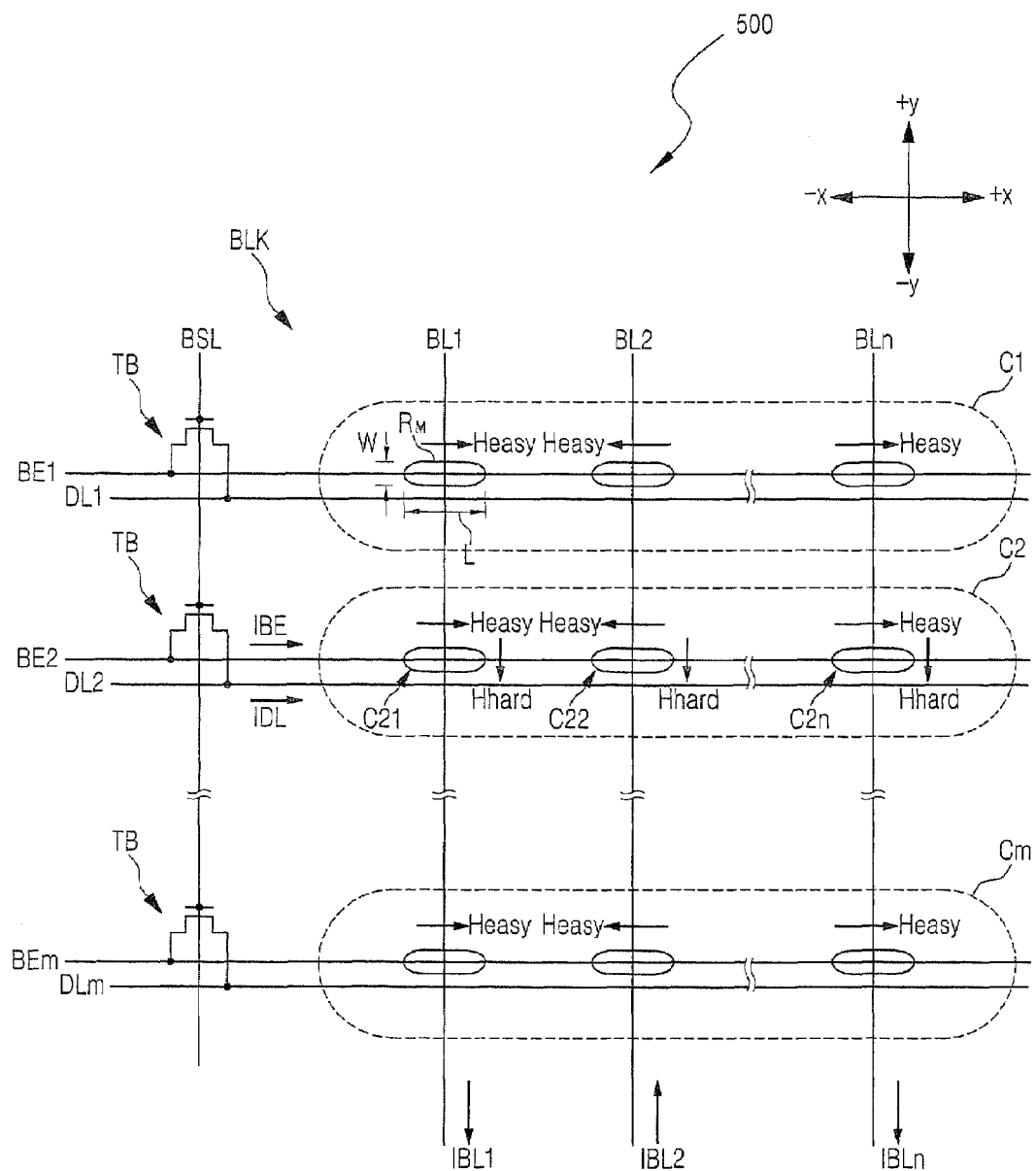
FIG. 6 is an equivalent circuit of a cross-point configuration of data cells in an MRAM programmed using a simultaneous write operation according to some embodiments of the invention.

FIG. 6 is an equivalent circuit diagram shown in FIG. 5 during a simultaneous write operation in some embodiments according to the invention. In particular, the simultaneous write operation to the block of resistive memory cells 500 can be performed by activating cell block switching transistors TB using a memory cell block select signal BSL. The cell block switching transistors TB enable a row of resistive memory cells $R_m$ to be activated by a signal provided via the respective bottom electrode signal line BE1-$m$.

Furthermore, the bitlines BL1-$n$ connected to each of the resistive memory cells in the rows of the block 500 are provided with currents IBL1-$n$ having directions that are associated with logical data value to be stored in the individual resistive memory cell in the group selected for programming. It will be understood that the signals provided by the bottom electrode signal line 1-$m$ can be coupled onto digit lines DL1-$n$ which are used to conduct a current across the group of resistive memory cells Rm to be programmed and, further, that the currents provided by the bitline BL1-$n$ also are conducted across the resistive memory cells Rm to be programmed.

The current provided by the respective digit line DL1-$n$ generates a hard magnetic field having a direction in each of the resistive memory cells based on the direction of the current provided via the digit line. Furthermore, the currents provided via the bitlines, BL1-$n$ generate respective easy magnetic fields, each having a direction based on the direction of the current IBL1-$n$.

In an exemplary write operation shown by FIG. 6, a simultaneous write operation can be performed to a group of resistive memory cells $C_2$ included in the block 500. In particular, a current $I_{DL}$ is provided to the digit line DL2 to provide the hard magnetic fields having the orientations shown whereas the individual currents IBL1-$n$ provided via the respective bitlines BL1-$n$ generate the respective easy magnetic fields, each having a direction based on the direction of the respective current IBL1-IBLn. For example, the easy magnetic field generated in the resistive memory cell C21 has the direction shown based on the direction of the current IBL1 whereas the easy magnetic field generated in resistive memory cell C22 is opposite that generated in C21 based on the opposing direction of the current IBL2.

As further shown in FIG. 6, the easy magnetic field generated in the resistive memory cell C2$n$ has the same direction as that generated in the resistive memory cell C21 based on the same direction of the current IBLn compared to IBL1. It will be understood that the logical data value stored in each of the resistive memory cells C21-C2$n$ is based on the combination of the respective easy and hard magnetic fields generated by the currents IDL and IBL1-$n$. A programming mode can be carried out using the signal levels shown in FIG. 15 in some embodiments according to the invention.

Figure 7:
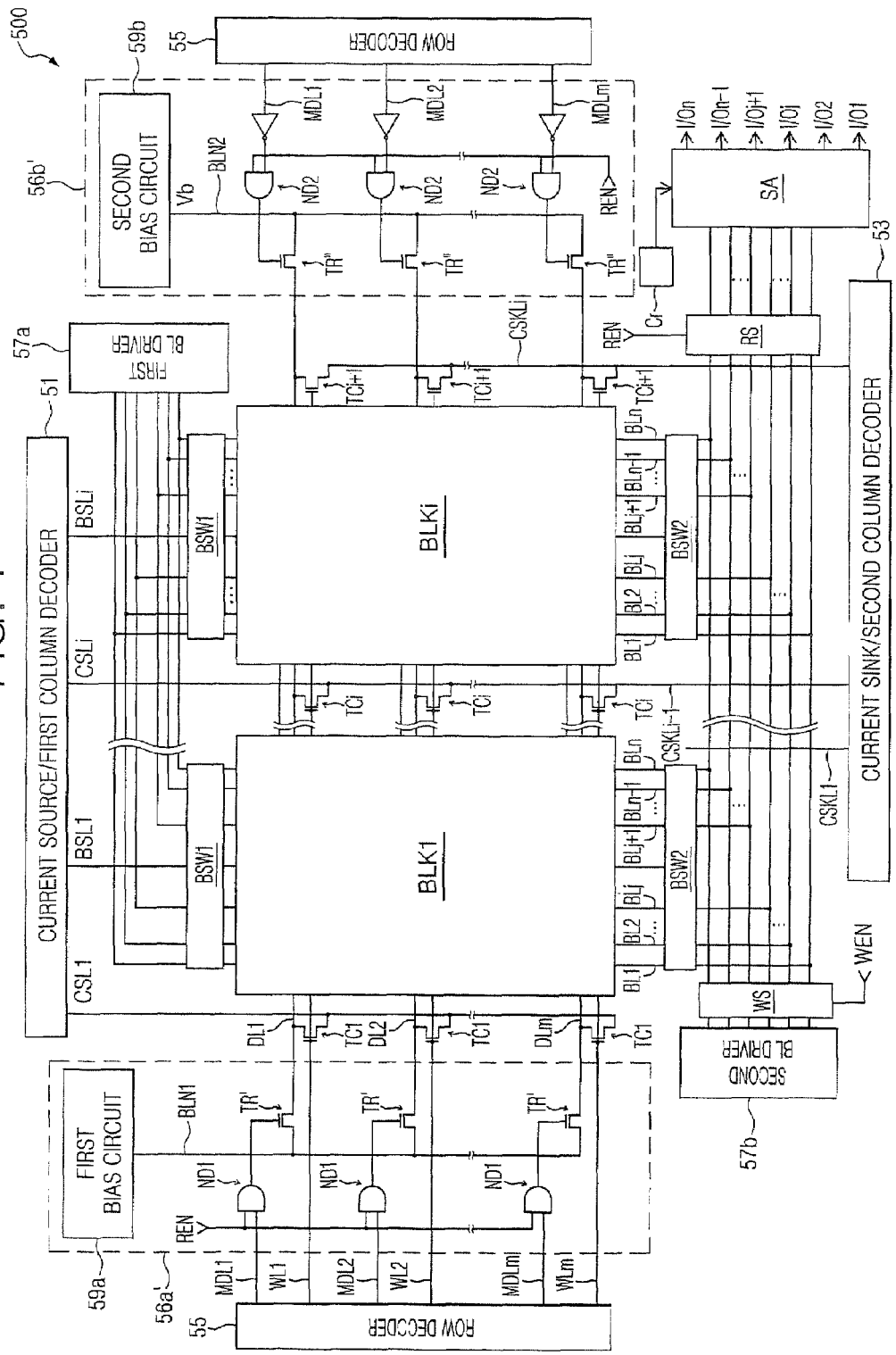
FIG. 7 is a schematic illustration of an MRAM including first and second bias circuits and current source transistors according to some embodiments of the invention.

FIG. 7 is a block diagram of an MRAM including first and second biasing circuits 59a/b and current source transistors TC1-TCi in some embodiments according to the invention. In particular, the first bias circuit 59A provides a first bias voltage to digit lines DL1-$m$ responsive to activation of transistors TR' by a row decoder 55. The first bias voltage provided by the bias circuit 59a can be provided to the selected block of resistive memory cells BLK1-$i$ through activation of switching transistors TB to couple the bias voltage to the bottom electrode of the resistive memory cell selected for access. A second bias voltage can be provided to the resistive memory cells selected for access by a bitline driver 57a/b that drives the bitlines coupled to the resistive memory cells responsive to a current source/column decoder 51 and current sync/column decoder 53.

A second bias circuit 59b can provide a second bias voltage to unselected memory blocks (i.e., memory blocks which are not to be accessed during a current read operation) responsive to a row decoder 55 through transistors TR'. Accordingly, the second bias circuit 59b can be used to apply biasing to otherwise unselected resistive memory cells to reduce the generation of parasitic currents which may otherwise affect currents generated by the biasing of resistive memory cells to be accessed (thereby reducing the likelihood of read errors).

Figure 8:
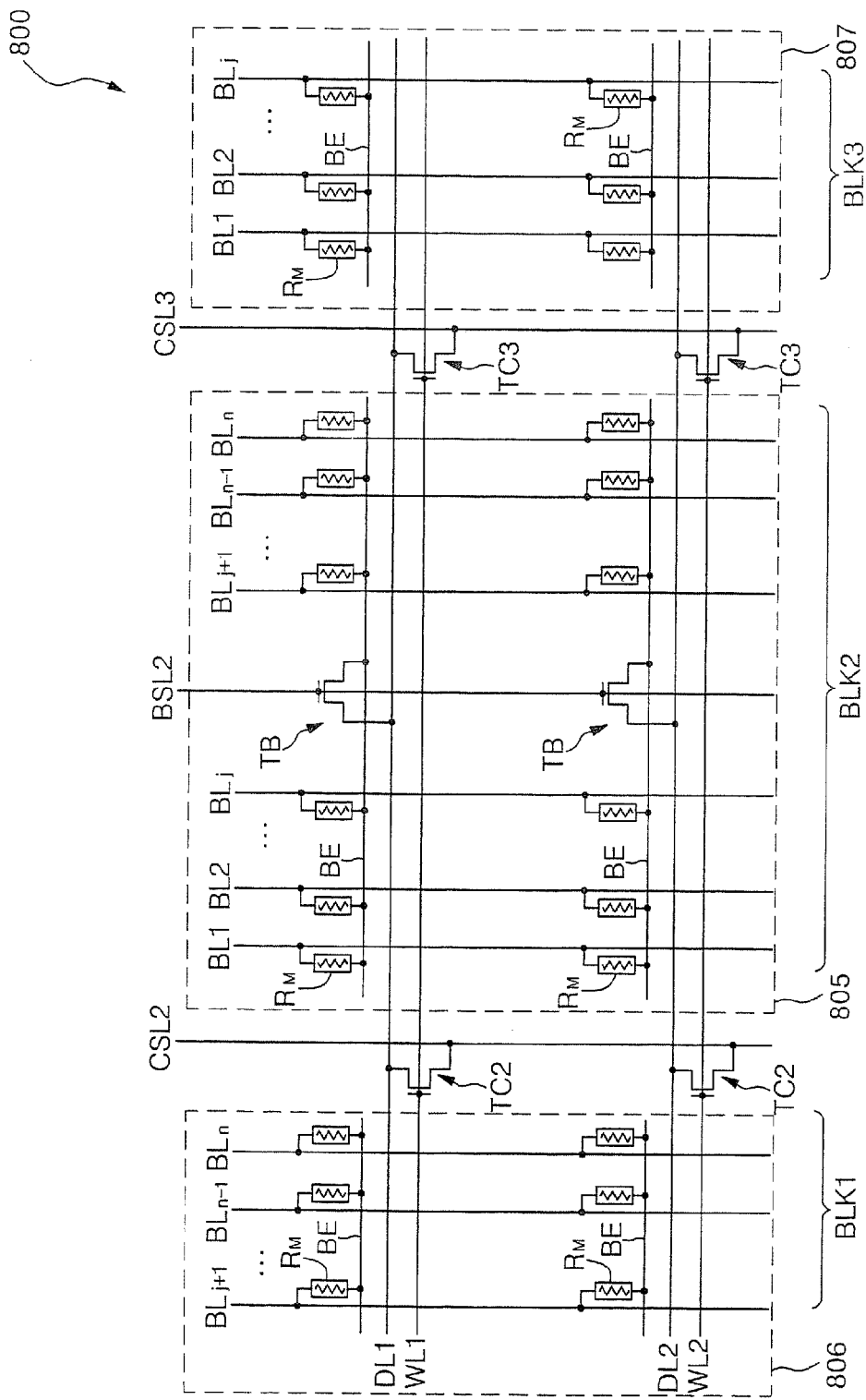
FIG. 8 is a simplified circuit schematic showing current source transistors according to some embodiments of the invention.

FIG. 8 is a simplified schematic illustration of a portion 800 of the MRAM 500 shown in FIG. 7 including current source transistors TC in some embodiments according to the invention. In operation, programming currents provided via lines CSL2 and 3 are conducted across resistive memory cells to be programmed while avoiding conducting the programming current across resistive memory cells that are not to be programmed.

A programming current used to program resistive memory cells Rm included in a memory block 805 is provided by a current source line CSL2. The current source line CSL2 is located in a space that separates the memory block 805 from adjacent memory block 806, which is not to be programmed. The current used to program the reference cells $R_m$ included in the block 805 is provided by the current source line CSL2 to the current source select transistors TC2 enabled by wordlines WL1 and WL2. The activation of the current source select transistors TC2 couples the programming current from the current source select line CSL2 to the digit lines DL1 and DL2. The programming current is conducted across the bitlines BL1-BLn adjacent to the resistive memory cells $R_m$ included in the memory block 805.

The current source select transistors TC3 are also enabled via the wordlines WL1 and WL2 to couple the programming current from the digit lines DL1 and DL2 onto the current source line CSL3 that is located in a space that separates the memory block 805 (being programmed) from an adjacent memory block 807, which is not to be programmed. The programming current is then conducted between the spacing that separates the memory block 805 from the memory block 807 to the current sync 53 shown in FIG. 7.

Accordingly, the programming current is conducted across the resistive memory cells $R_m$ to be programmed while avoiding crossing resistive memory cells that are included in memory blocks that are not to be programmed. In particular, the programming currents are conducted in the spaces that separate the block to be programmed from the blocks that are not programmed substantially parallel to the bitlines. Avoiding crossing resistive memory cells that are not selected for programming can reduce the likelihood that the unselected resistive memory cells can be remain undisturbed by the programming current.

Figure 9:
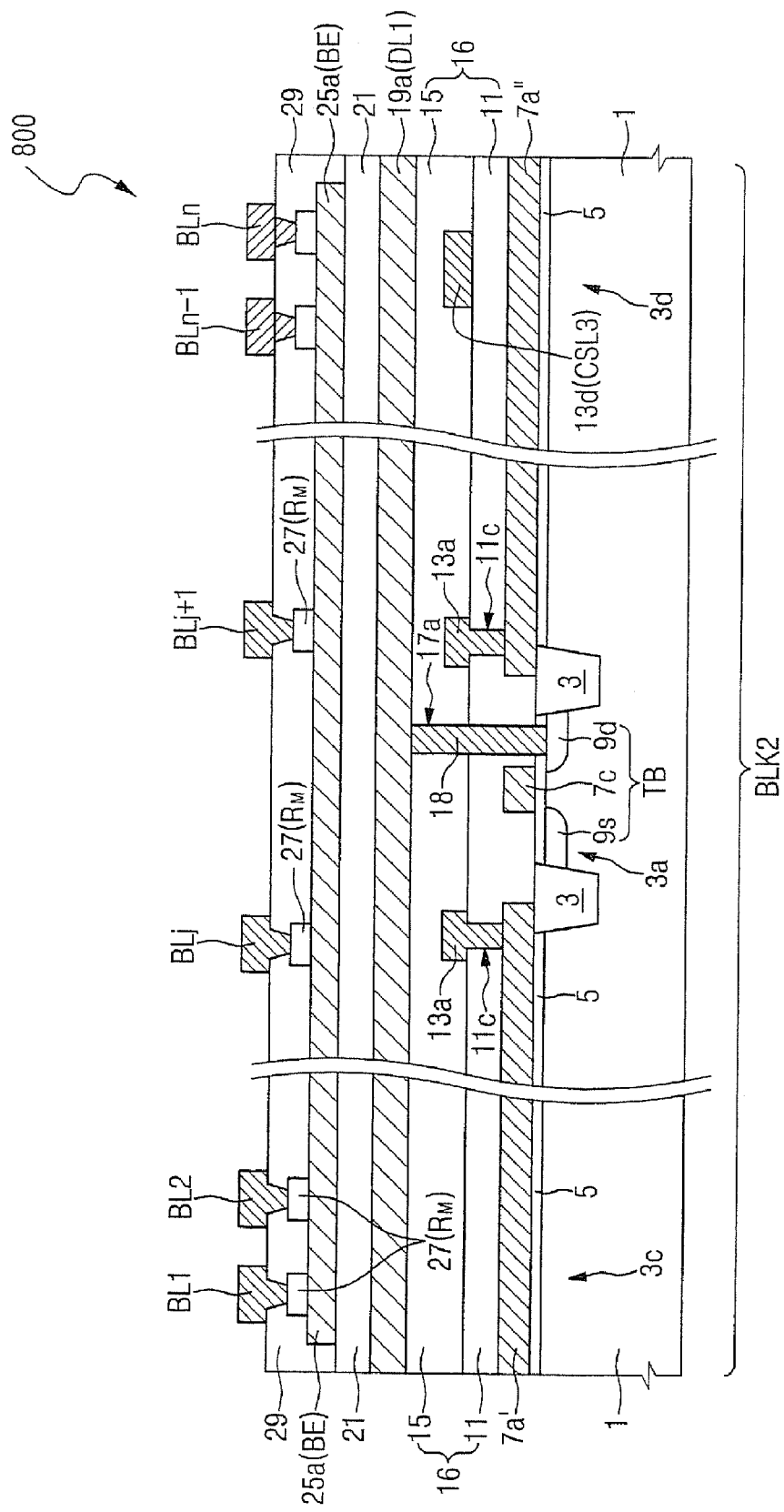
FIG. 9 is a cross-sectional view of the simplified circuit shown in FIGS. 7 and 8.
Figure 10:
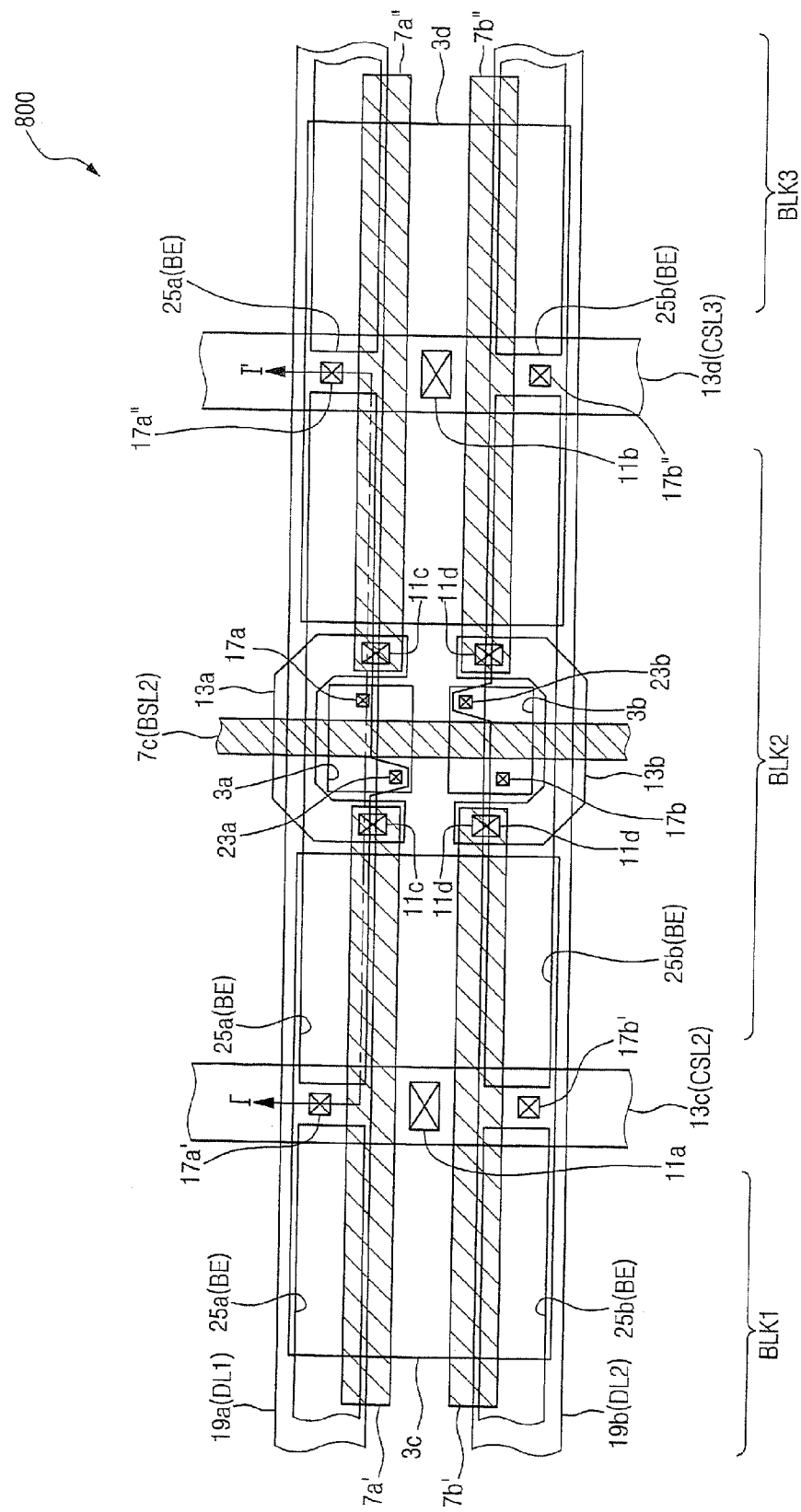
FIGS. 10 and 11 are plan views of the circuit illustrated by FIGS. 7 through 9.
Figure 11:
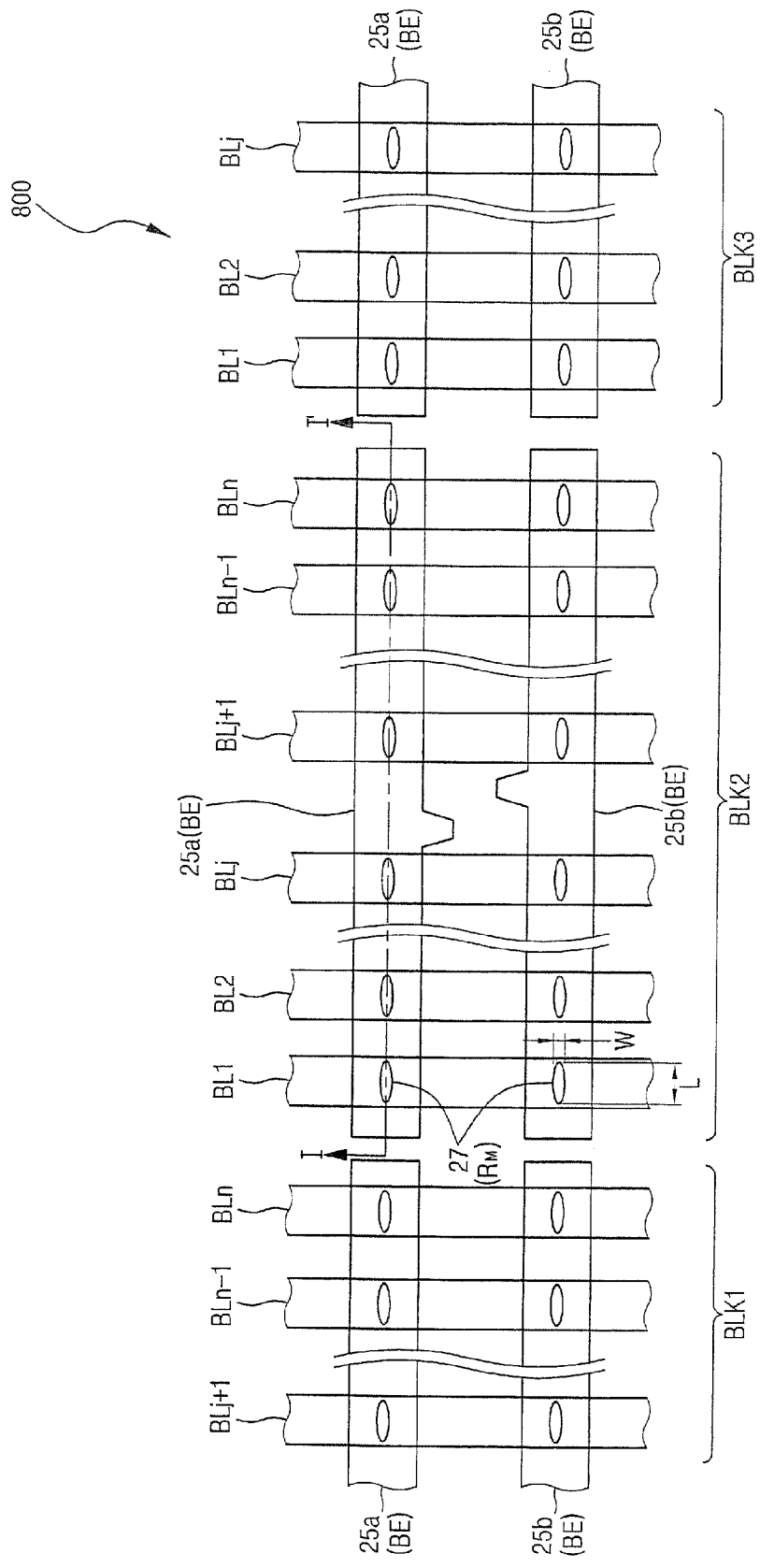
Figure 12:
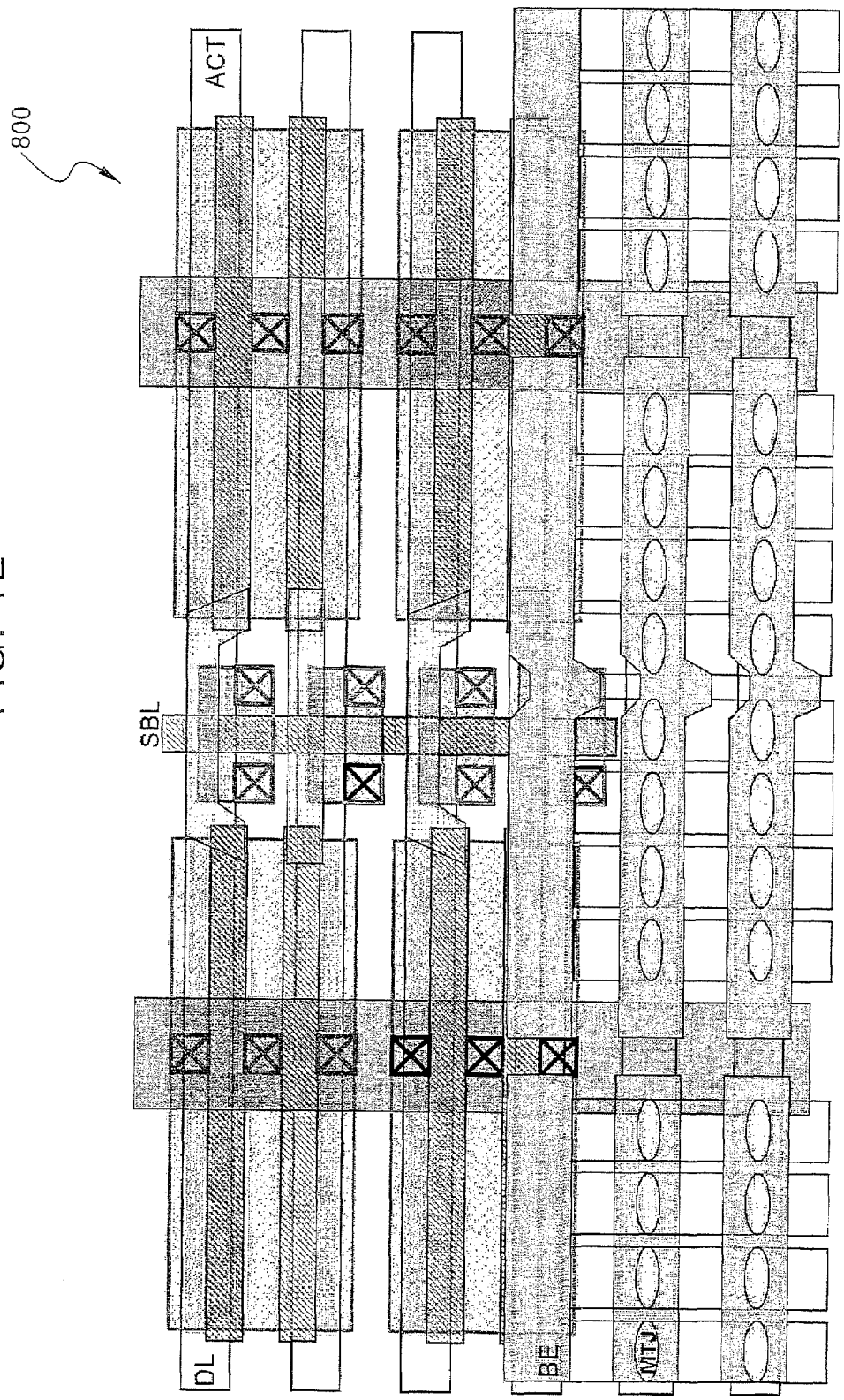
FIG. 12 is a layout diagram for the simplified circuit schematic illustrated by FIGS. 7 through 11.

FIG. 9 is a cross sectional view of layers included in a portion of an MRAM corresponding to the portion 800 in FIG. 8 and the cross-section I-I' shown in FIGS. 10-12, which represent plan views and a layout respectively in some embodiments according to the invention. Referring to FIG. 9, the cross-section corresponding to the portion 800 shown in FIG. 8 includes a substrate 1 including an oxide layer 5 and isolation layers 3 used to isolate the cell block switching transistor TB having source and drain regions 9S/9D formed in active region 3A. The cells block switching transistor also includes a cellblock select line 7C connected to a gate electrode thereof.

An interconnect 18 couples the drain 9D of the cellblock switching transistor TB to a digit line 19A which can be coupled to a bottom electrode 25A (separated from the digit line 19A by an interlayer dielectric 21) via the cellblock switching transistor TB. The bottom electrode 25A is coupled to the resistive memory cells 27 which are in-turn contacted by the bitlines BL1-BLN. The structure of the bottom electrode, and the resistive memory cells 27 are covered by an upper interlayer dielectric layer 29.

Still referring to FIGS. 9-12, a first sub-wordline 7A' and a second sub-wordline 7A" are connected to first and second local interconnect lines 13A that is separated from the underlying sub-wordlines 7A and 7A" by an interlayer dielectric 11. First and second current source lines CSL2 and CSL3 are shown as layers 13C and D respectively on the interlayer dielectric 11 which is also covered by an interlayer dielectric layer 15.

Figure 13:
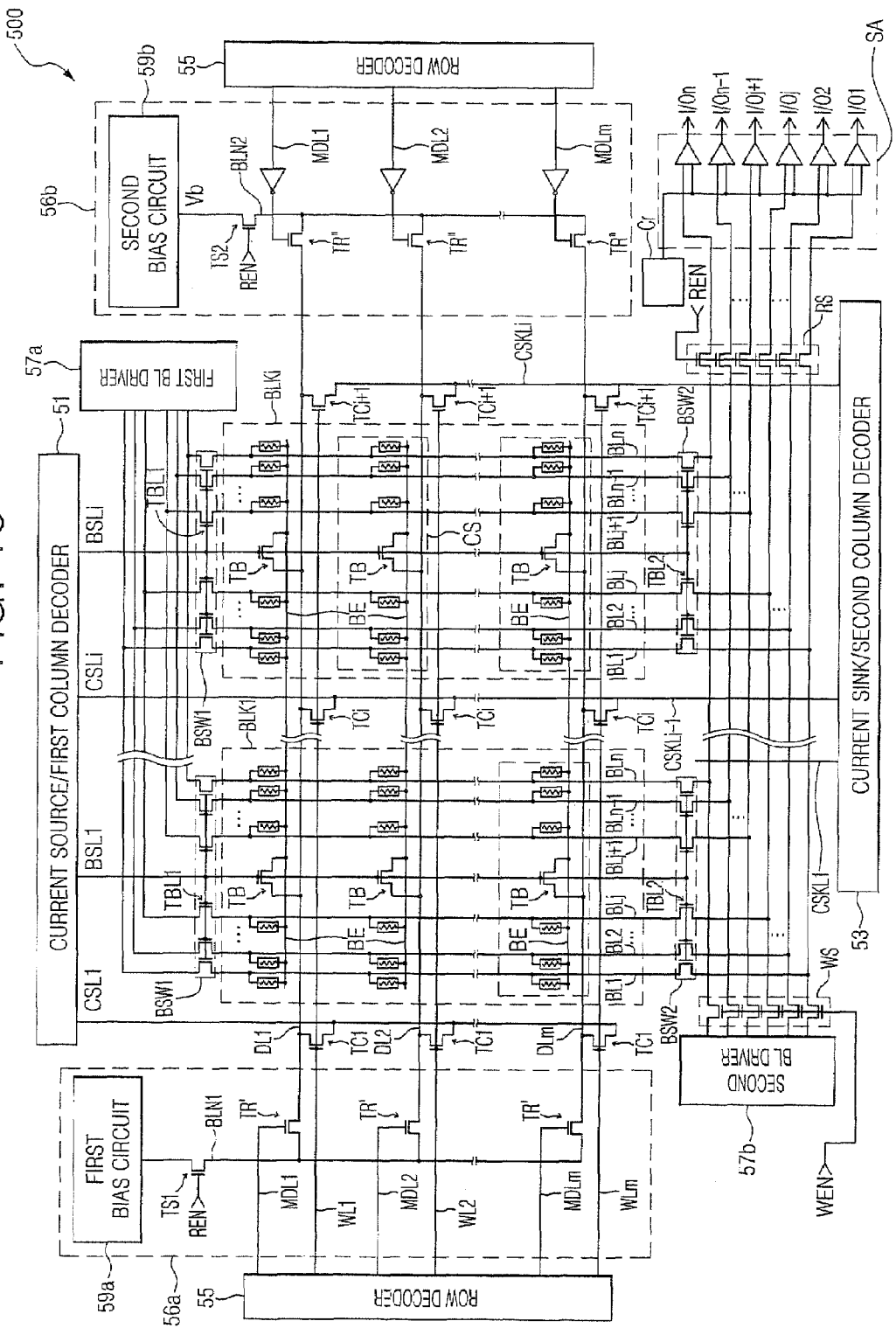
FIG. 13 is a block diagram of an MRAM including first and second bias circuits and current source transistors according to some embodiments of the invention.

FIG. 13 is a simplified circuit schematic illustrating first and second bias circuits 59a and 59b used to provide different bias voltages to resistive memory blocks BLK1-i in some embodiments according to the invention. In particular, the first bias circuit 59a provides and first bias voltage to a bias line BLN1 that is coupled to the pass transistors TR'. The pass transistors TR' are enabled responsive to an output of an enable gate ND1 which is enabled by a read enable signal REN and outputs from the row decoder circuit 55.

The second bias circuit 59b provides a second bias voltage to resistive memory blocks that are not selected for access during a read operation. In particular, the second bias circuit 59b provides a second bias voltage via a bias line BLN2 that is provided to unselected memory blocks via past transistors TR" that are enabled responsive to enable gates ND2 enabled in response to the read enable signal and inverted outputs of the row decoder that are analogous to those used to enable the pass transistors associated with the first bias circuit 59a. As shown in FIG. 13, the respective voltages provided by the first and second bias circuits 59a and 59b can be provided to the respective resistive memory blocks across only the single pass transistor TR'/TR" to the digit line (or wordline) coupled to the respective memory block.

Figure 14:
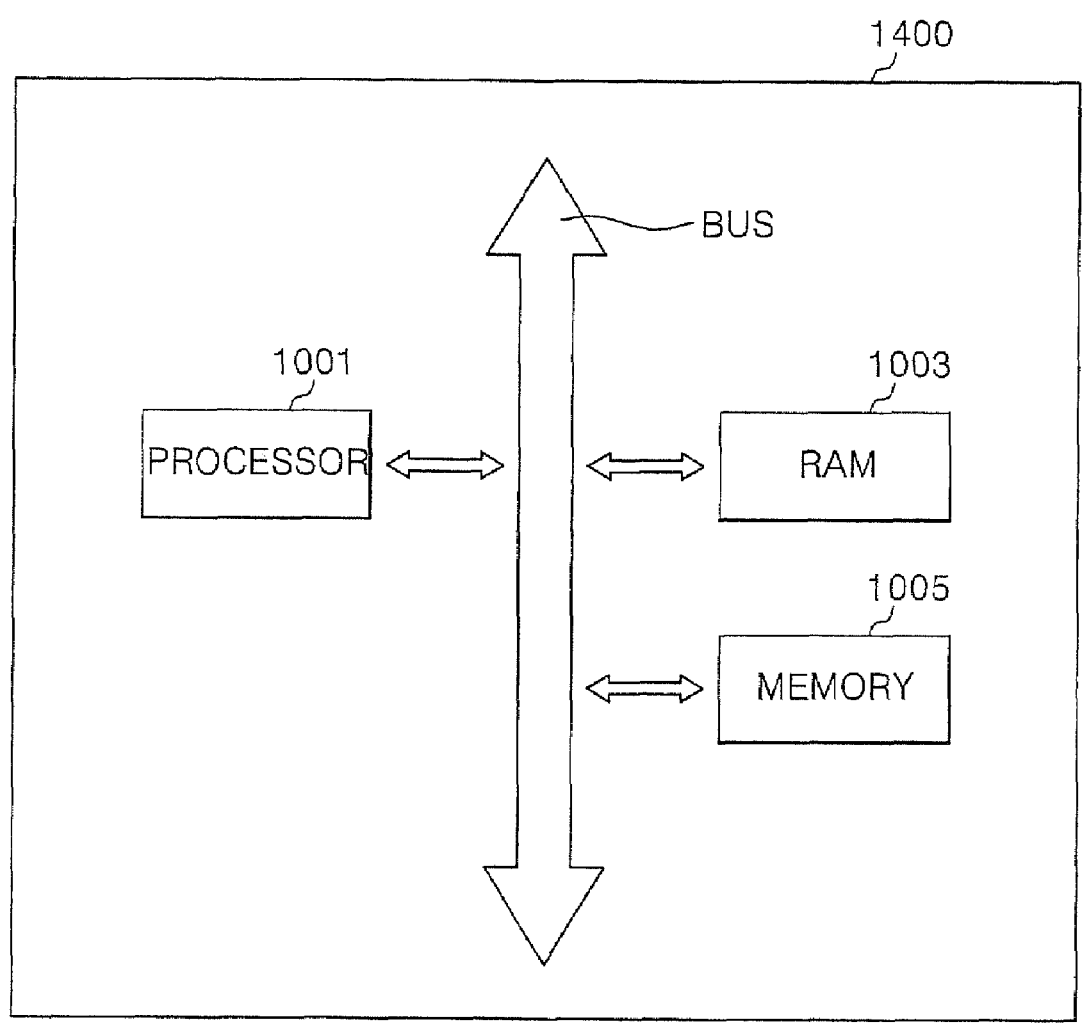
FIG. 14 is a high-level block diagram illustrating systems including MRAMs according to some embodiments in the invention.

FIG. 14 is a high-level block diagram that illustrates systems 1400 including MRAM devices according to some embodiments of the invention. In particular, MRAMs can be utilized in a wide variety of systems including, generally, a processor circuit 1001, IO devices 1005, and a bus interconnecting these components (as well as other components included in the system 1400 as well as external components coupled thereto.) The types of systems included in the system 1400 can be personal media players, mobile navigation systems, home appliances, personal digital assistance, personal computers, digital cameras, televisions, game consoles, or the like.

As described herein, in some embodiments according to the invention, a resistive memory device can be read by applying a predetermined voltage level to a first word line coupled to a first resistive memory cell during a read operation of a second resistive memory cell that is coupled to a second wordline. For example, in an operation where a first group of memory cells is to be simultaneously read from a block, a first voltage level can be applied to wordlines of memory cells that are not selected for the read operation, whereas a second voltage can be applied to the wordline that is coupled to the memory cells that are selected for the read operation.

Furthermore, the bitlines coupled to the resistive memory cells (both selected as well as the non-selected) can have the first voltage level applied thereto so that the unselected memory cells are substantially non-biased due to the fact that the associated bitline and wordline for each of the unselected memory cells has substantially the same voltage applied thereto. In contrast, the memory cells that are selected for the read are biased by the different voltages applied to the bitlines and wordlines of the selected memory cells. The non-biasing of the unselected memory cells may avoid the generation of parasitic currents which may otherwise increase/decrease the current generated by biasing of the selected memory cells. If unaddressed, the parasitic currents can, therefore, affect operation of sense amplifier circuits which (if the parasitic currents are significant enough) cause errors during the read operation.

In still other embodiments according to the invention, current used to program resistive memory cells in a block of the device can be conducted across a single block of resistive memory cells to be programmed. Accordingly, the programming current may be conducted to the block to be programmed by conducting the programming current between adjacent blocks of resistive memory cells to a first current source transistor that is located on a first opposing side of the block of resistive memory cells to be programmed. The first current source transistor is used to transfer the programming current from the area between the adjacent blocks of resistive memory cells to across the block of memory cells to be programmed. Furthermore, a second current source transistor is located opposite the first current source transistor and is located between the block of the resistive memory cells to be programmed and a further adjacent block of resistive memory cells which are not to be programmed.

The second current source transistor can conduct the programming current away from the block of resistive memory cells to be programmed in the area that separates the adjacent resistive memory block. Accordingly, conducting the programming currents using the two opposing current source transistors allows the programming current to be conducted across bitlines in the block of resistive memory cells to be programmed while avoiding conducting the programming current across bitlines included in adjacent blocks of resistive memory cells that are not to be programmed. Avoiding conducting the programming current across the bitlines of resistive memory cells that are not to be programmed can reduce the likelihood of disturbing the data stored in the resistive memory cells which are not to be programmed, thereby reducing the likelihood of an error for a read of the disturbed resistive memory cells.

In other embodiments according to the invention, a resistive memory device can include first and second bias circuits that are configured to apply voltage levels to both selected as well as unselected wordlines during a read operation. For example, in some embodiments according to the invention, a first bias circuit can be used to generate a voltage level that is applied to the wordlines connected to resistive memory cells that are to be read, whereas a second bias circuit can be used to generate the second voltage level applied to the wordlines coupled to the memory cells that are not to be read.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed:

1. A magnetic memory cell array device comprising:
    a first current source line extending between first and second memory blocks including respective pluralities of first and second memory cells configured for respective simultaneous programming and configured to conduct adequate programming current for writing one of the pluralities of first and second memory cells;
    a first current source transistor coupled to the first current source line and to a word line;

a programming conductor coupled to the first current source transistor and extending across bit lines in the first and second memory blocks, configured to conduct the programming current across the bit lines;

a second current source transistor coupled to the programming conductor and configured to switch the programming current from the programming conductor to a second current source transistor output;

a second current source line coupled to the second current source transistor and extending adjacent the first current source line and separated from the first current source line by the first or second memory block;

a first bias circuit configured to apply a first bias voltage to the first or second memory cells selected for accessed during a read operation; and a second bias circuit configured to apply a second bias voltage to the first or second memory cells unselected for access during the read operation, the device further comprising:

a bit line driver circuit configured to provide a third bias voltage to the first or second memory cells unselected for access during the read operation, the third bias voltage being substantially equal to the second bias voltage;

first and second pass transistors each coupled between respective outputs of the first and second bias circuits and the word line; and first and second enable gates coupled to gates of the first and second pass transistors, configured to pass the predetermined voltage level from the respective outputs to the word line through the pass transistors responsive to outputs of the enable gates.

2. A magnetic memory cell array according to claim 1 wherein the first and second pass transistors each provide a single voltage drop across respective devices between the outputs and the first word line.

3. A magnetic memory cell array according to claim 1, wherein the magnetic memory cell array is included in a personal media player, mobile navigation system, home appliance, personal digital assistance, personal computer, digital camera, television, or game console.

4. A magnetic memory cell array according to claim 1, wherein the programming conductor comprises a digit line.

* * * * *